United States Patent [19]
Schneider et al.

[11] Patent Number: 5,587,661
[45] Date of Patent: Dec. 24, 1996

[54] DEVICE FOR INDICATING ERRORS IN A CONTROL LINE OF AN ELECTRIC CONTROL UNITS

[75] Inventors: Thomas Schneider, Markgroeningen; Stefan Grieser-Schmitz, Mainz; Michael Walther, Ludwigsburg, all of Germany

[73] Assignee: Robert Bosch GmbH, Stuttgart, Germany

[21] Appl. No.: 355,747

[22] Filed: Dec. 14, 1994

[30] Foreign Application Priority Data

Dec. 14, 1993 [DE] Germany .................. 43 42 586.0

[51] Int. Cl.⁶ .................... G01R 31/02; G08B 19/00
[52] U.S. Cl. .................. 324/556; 324/133; 324/555; 340/650
[58] Field of Search .................... 324/555, 556, 324/522, 713, 133; 340/825.16, 825.17, 461, 525, 641, 642, 644, 648, 650

[56] References Cited

U.S. PATENT DOCUMENTS 4,354,182  10/1982  Frey ........................ 340/650
5,051,732   9/1991  Robitaille ................. 340/650

FOREIGN PATENT DOCUMENTS 3627802   2/1988  Germany .
56-022970  3/1981  Japan .
9221985  12/1992  WIPO .

OTHER PUBLICATIONS

"Line Tester With Computer Effect," Jul. 1979, Funkschau, Bd. 51, Nr. 15.

*Primary Examiner*—Kenneth A. Wieder
*Assistant Examiner*—Diep Do
*Attorney, Agent, or Firm*—Kenyon & Kenyon

[57] ABSTRACT

An indicating device for electric control units has a light-emitting diode together with at least two resistors placed between a supply voltage and ground. A control line extends from the control unit and is connected between the two resistors. The control unit controls the potential on the control line in such a manner that when a defect is recognized an indication is provided. An indication is also provided in the event of a short circuit between the control line and the supply voltage, as well as upon an interruption in the control line.

8 Claims, 1 Drawing Sheet

DEVICE FOR INDICATING ERRORS IN A CONTROL LINE OF AN ELECTRIC CONTROL UNITS

FIELD OF THE INVENTION

The present invention relates to an indicating device for electric control units.

BACKGROUND OF THE INVENTION

Electric control units which are intended, for instance, for the control of an internal combustion engine, produce an indication upon the occurrence of defects. For this purpose, the indicating means are actuated over a control line. In connection with the monitoring of safety-relevant devices in motor vehicles, for instance anti-lock brake systems, it is necessary that the control line also be monitored so that it is possible to recognize a break in the control line as well as a short circuit between the control line and the supply voltage. Such a device is described in German Utility Model Application No. G 93 131 291, which has not yet been published. That device is, however, of relatively expensive construction.

SUMMARY OF THE INVENTION

The indicating device for electric control units in accordance with the present invention has the advantage that it is of very simple construction and reliably indicates both a break in the control line and a short circuit between the control line and a line which lies at the supply voltage.

The device according to the present invention is made possible in the manner that the indicating means are placed via a voltage divider between a supply voltage and ground, and the control line is connected between the two resistors of the voltage divider. The voltage controlled by the control unit on the control line has a value which assures that the indicating means will be actuated both upon a defect noted by the control unit which is to be indicated, as well as upon a break in the control line or a short circuit between the control line and a line which lies at the supply voltage.

Another advantageous feature of the present invention resides in the use of a light-emitting diode as indicating means and which lies in the forward direction in series with the resistors. It is particularly advantageous to also provide in this series circuit a zener diode in the reverse direction, whereby the circuit operates independently, even upon a ground displacement.

DETAILED DESCRIPTION OF THE INVENTION

Figure 1:
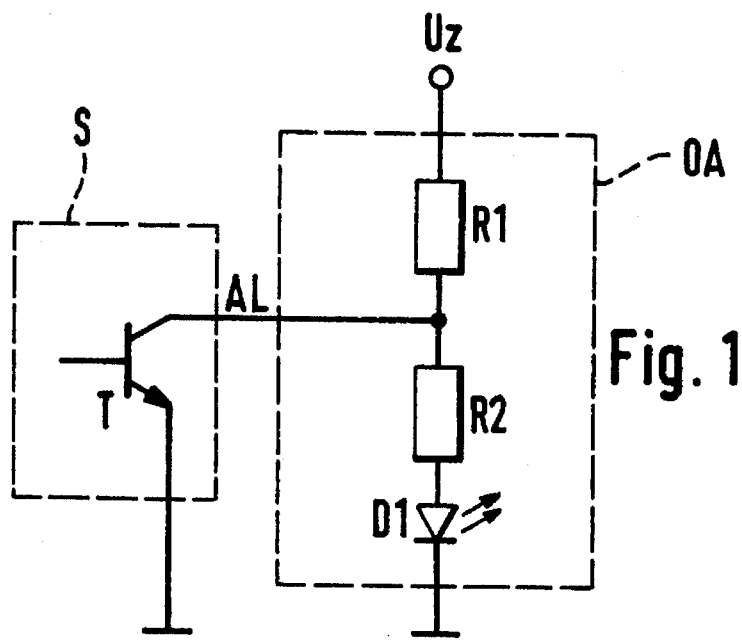
FIG. 1 shows a first embodiment of the device according to the present invention in which a series circuit, including two resistors and a diode, lies between a supply voltage and ground.

FIG. 1 shows a first embodiment of the device according to the present invention in which a series circuit, including the resistors R1, R2 and the diode D1, lies between the supply voltage Uz and ground. The diode D1 is a light-emitting diode which is connected in the conducting direction. The two resistors R1 and R2, as well as the light-emitting diode D1, form an optical-indicating device OA.

Between the resistors R1 and R2 there is connected the control line AL which, on the other side, is connected to the control unit S. In this connection, the wiring is customarily such that the control line is connected to the collector of a transistor T, while the emitter of the transistor T is connected to ground. The base voltage of the transistor T is so controlled by the control unit that the light-emitting diode D1 lights up when an error is detected by the control unit S.

The control line AL is connected between the two resistors R1 and R2. The light-emitting diode lies on the other side of the resistor R2, and the other side of the resistor R1 lies at the supply voltage. As a result, the light-emitting diode D1 also lights up upon an interruption in the control line, since current then flows to ground through the resistors R1 and R2 as well as the light-emitting diode D1.

In the event of a short circuit between the control line AL and the supply voltage Uz, the current flows directly through the resistor R2 and the light-emitting diode D1 and the latter again lights up. Upon a short circuit of T, the collector remains at the supply voltage Uz.

If there is no break between the control line AL and the optical display OA and no short circuit between the control line AL and the supply voltage Uz, the diode D1 does not light up when the transistor is conductive. In this case, the voltage at the junction between the two resistors R1 and R2 has dropped to such an extent that the voltage drop over the light-emitting diode D1 is no longer sufficient to cause it to light up.

If, on the other hand, with the indicating device of the present invention in operation, an improper condition of operation or a defect is noted by the control unit which is to be indicated, this takes place in the manner that the control unit, by means of the transistor T, controls the voltage of the control line AL. Thus, the control unit also controls the voltage between the two resistors R1 and R2 in such a manner that a current flows through the resistor R1, the resistor R2, and the diode D1, and the latter lights up.

Figure 2:
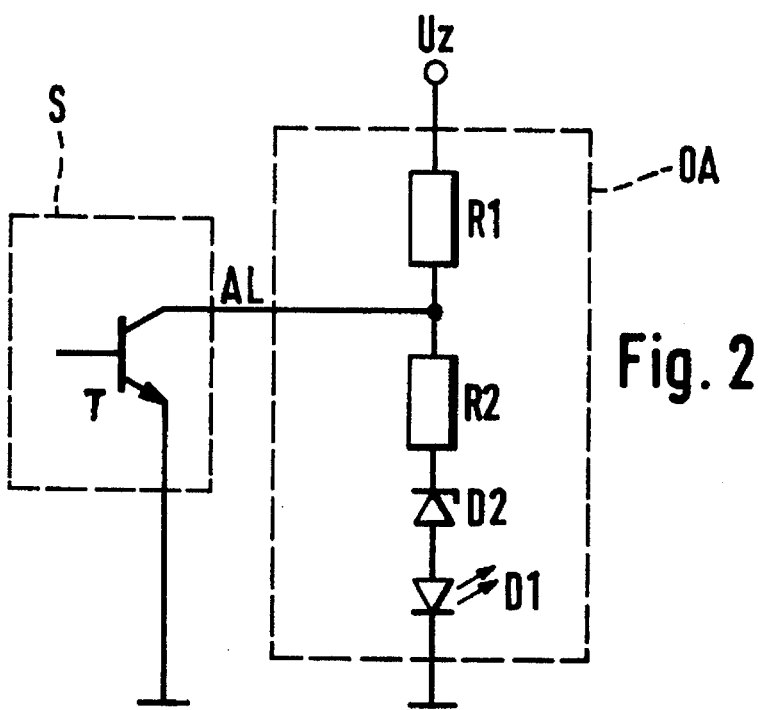
FIG. 2 shows a second embodiment of the device according to the present invention in which a series circuit, including two resistors, a diode, and a zener diode connected in the reverse direction, lies between a supply voltage and ground.

FIG. 2 shows another embodiment of the device according to the present invention which, in principle, operates in the same manner as the embodiment shown in FIG. 1, identical parts bearing the same reference numerals. In addition, in this embodiment, a zener diode D2 is contained in the optical display OA. The zener diode D2 is connected in the reverse direction between the resistor R2 and the light-emitting diode D1. Thus, the zener diode D2 has the effect that the optical display 0A operates even in the event of a shift in ground potential between the optical display device and the control unit S.

The potential of the control line AL, which is controlled by the control unit S by switching of the transistor T, must be so high that in the case of defects recognized by the control unit and of desired indication via D1, a current can flow through R1, R2, the zener diode D2, and the light-emitting diode D1. If no indication is to be given, the transistor T again becomes conductive and the light-emitting diode D1 does not light up.

Upon a break in the control line AL, the full voltage Uz lies on the series connection of the two resistors R1, R2, as well as the diodes D2 and D1. In this case, the diode D1 lights up in the same way as in the case of a short circuit between the control line AL and the supply voltage Uz.

The two embodiments of the device according to the present invention discussed above have merely resistors and diodes. Therefore, no active components are necessary for the indications according to the present invention. This is also true, in particular, for the optical display OA.

Instead of a light-emitting diode D1, some other optical display can also be used, for instance an incandescent bulb or a glow lamp. If an indication other than a optical display or some other suitable means is to be given, the diode D1 can also be replaced with an acoustic unit.

What is claimed is:

1. An indicating device for an electric control unit having a control line, the indicating device comprising:
    at least two resistors connected in series and defining a junction point therebetween, the control line being connected to the junction point; and
    means, connected in series with the at least two resistors and coupled between a supply voltage and a ground, for indicating a break in the control line upon the occurrence of the break and for indicating a short-circuit between the control line and the supply voltage upon the occurrence of the short-circuit.

2. The indicating device according to claim 1, wherein the means for indicating includes a light-emitting diode connected in a forward direction.

3. The indicating device according to claim 1, wherein the means for indicating includes a lamp.

4. The indicating device according to claim 1, further comprising a zener diode connected between the at least two resistors and the means for indicating, the zener diode being polarized in a reverse direction.

5. The indicating device according to claim 1, wherein the at least two resistors and the means for indicating form an optical display device.

6. The indicating device according to claim 1, wherein the electric control unit includes a transistor for controlling the control line.

7. The indicating device according to claim 6, wherein the transistor controls a potential of the control line so that the potential of the control line is high when the control line is intact and an error condition is detected by the electric control unit.

8. The indicating device according to claim 6, wherein a collector of the transistor is connected to the control line, an emitter of the transistor is connected to the ground, and a base of the transistor is connected to the control unit so that a base potential of the transistor is controlled by the control unit.

* * * * *